(12) United States Patent
Chen et al.

(10) Patent No.: US 10,759,654 B2
(45) Date of Patent: Sep. 1, 2020

(54) ROUGH ANTI-STICTION LAYER FOR MEMS DEVICE

(71) Applicant: Taiwan Semiconductor Manufacturing Co., Ltd., Hsin-Chu (TW)

(72) Inventors: Yu-Jui Chen, Taipei (TW); I-Shi Wang, Sanxia Township (TW); Ren-Dou Lee, Hsinchu (TW); Jen-Hao Liu, Zhunan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/229,902

(22) Filed: Dec. 21, 2018

(65) Prior Publication Data

US 2019/0119099 A1    Apr. 25, 2019

Related U.S. Application Data

(60) Division of application No. 15/885,016, filed on Jan. 31, 2018, now Pat. No. 10,173,886, which is a continuation of application No. 15/006,301, filed on Jan. 26, 2016, now Pat. No. 9,884,755.

(51) Int. Cl.
*B81B 3/00* (2006.01)
*B81C 1/00* (2006.01)

(52) U.S. Cl.
CPC ............ *B81B 3/0005* (2013.01); *B81B 3/001* (2013.01); *B81C 1/00984* (2013.01); *B81B 2203/04* (2013.01); *B81B 2207/012* (2013.01); *B81B 2207/07* (2013.01); *B81C 2201/0132* (2013.01); *B81C 2203/037* (2013.01); *B81C 2203/0785* (2013.01)

(58) Field of Classification Search
None
See application file for complete search history.

(56) References Cited

U.S. PATENT DOCUMENTS

| | | | |
|---|---|---|---|
| 9,527,721 | B2 | 12/2016 | Cheng et al. |
| 9,884,755 | B2 | 2/2018 | Chen et al. |
| 2009/0200619 | A1 | 8/2009 | Ridley |
| 2017/0047785 | A1 | 2/2017 | Twelker et al. |

OTHER PUBLICATIONS

Non-Final Office Action dated Apr. 11, 2017 for U.S. Appl. No. 15/006,301.

(Continued)

*Primary Examiner* — Long Pham
(74) *Attorney, Agent, or Firm* — Eschweiler & Potashnik, LLc

(57) ABSTRACT

The present disclosure relates to a method for manufacturing a microelectromechanical systems (MEMS) package. The method comprises providing a CMOS IC including CMOS devices arranged within a CMOS substrate. The method further comprises forming and patterning a metal layer over the CMOS substrate to form an anti-stiction layer and a fixed electrode plate and forming a rough top surface for the anti-stiction layer. The method further comprises providing a MEMS IC comprising a moveable mass arranged within a recess of a MEMS substrate and bonding the CMOS IC to the MEMS IC to enclose a cavity between the moveable mass and the fixed electrode plate and the anti-stiction layer.

20 Claims, 8 Drawing Sheets

(56) References Cited

OTHER PUBLICATIONS

Notice of Allowance dated Sep. 20, 2017 for U.S. Appl. No. 15/006,301.
Non-Final Office Action dated May 3, 2018 for U.S. Appl. No. 15/885,016.
Notice of Allowance dated Nov. 14, 2018 for U.S. Appl. No. 15/885,016.

ROUGH ANTI-STICTION LAYER FOR MEMS DEVICE

REFERENCE TO RELATED APPLICATIONS

This Application is a Divisional of U.S. application Ser. No. 15/885,016, filed on Jan. 31, 2018, which is a Continuation of U.S. application Ser. No. 15/006,301, filed on Jan. 26, 2016 (now U.S. Pat. No. 9,884,755, issued on Feb. 6, 2018). The contents of the above-referenced patent applications are hereby incorporated by reference in their entirety.

BACKGROUND

Microelectromechanical systems (MEMS) devices, such as accelerometers, pressure sensors and gyroscopes, have found widespread use in many modern day electronic devices. For example, MEMS accelerometers are commonly found in automobiles (e.g., in airbag deployment systems), tablet computers or in smart phones. For many applications, MEMS devices are electrically connected to application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
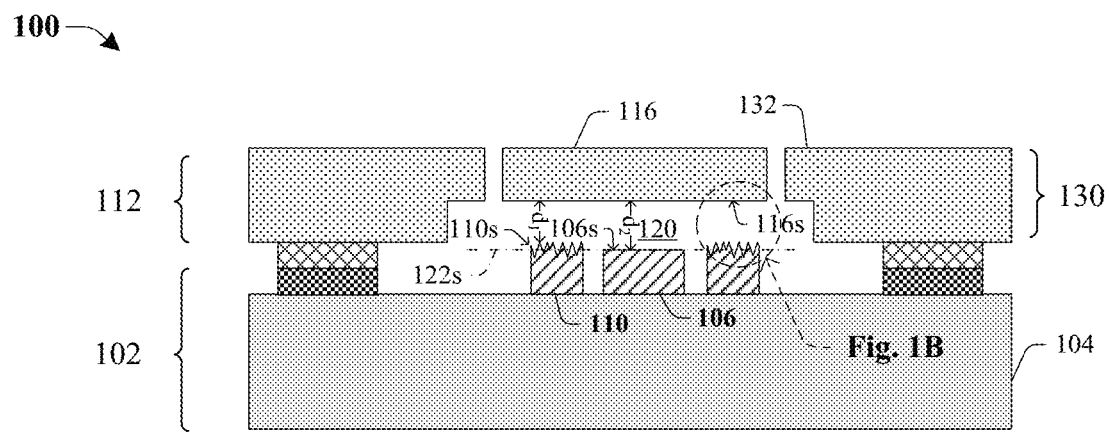
FIG. 1A illustrates a cross-sectional view of some embodiments of a microelectromechanical systems (MEMS) package with a rough metal anti-stiction layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some microelectromechanical systems (MEMS) devices, such as accelerometers and gyroscopes, comprise a moveable mass and a neighboring fixed electrode plate arranged within a cavity. The moveable mass is moveable or flexible with respect to the fixed electrode plate in response to external stimuli, such as acceleration, pressure, or gravity. A distance variation between the moveable mass and the fixed electrode plate is detected through the capacitive coupling of the moveable mass and the fixed electrode plate and transmitted to a measurement circuit for further processing.

Due to the moveable or flexible parts, MEMS devices have several production challenges that are not encountered with CMOS circuits. One significant challenge with MEMS devices is surface stiction. Surface stiction refers to the tendency of a moveable or flexible MEMS part to come into contact with a neighboring surface and "stick" to the neighboring surface. This "stiction" can occur at the end of manufacturing, such that the moveable or flexible part is not quite released from the neighboring surface, or can occur during normal operation when the component suddenly becomes "stuck" to the neighboring surface. As feature sizes shrink for successive generations of technology, surface stiction is becoming an increasingly important consideration in MEMS devices. Surface stiction can arise due to any one of several different effects, such as capillary force, molecular van der Waals force or electrostatic forces between neighboring surfaces. The extent to which these effects cause stiction can vary based on many different factors such as temperature of the surfaces, contact area between the surfaces, contact potential difference between the surfaces, whether the surfaces are hydrophilic or hydrophobic, and so on. Approaches have been used to attempt to limit surface stiction, for example, performing surface treatment or coating to the moveable mass or cavity surfaces to change hydrophilic properties of the surfaces. However, these approaches are difficult to integrate with various manufacturing processes and introduce contamination.

The present application is related to a MEMS package with a rough metal anti-stiction layer to improve stiction characteristics, and associated methods of forming such a MEMS package. The MEMS package comprises a MEMS IC bonded to a CMOS IC. An anti-stiction layer is disposed on the CMOS IC under a moveable mass of the MEMS IC. The anti-stiction layer has a rough top surface made up of a series of peaks and valleys. These peaks and valleys, which limit the overall contact area to points where the peaks of the anti-stiction layer meet a lower surface of the moveable mass, help improve stiction characteristics. Therefore, stiction can be avoided at the end of the manufacturing process and/or during normal operation of the MEMS package, and reliability is accordingly improved. The concept will be illustrated herein with regards to some example MEMs devices, but it will be appreciated that the concept is applicable to suitable MEMS device employing moveable parts, including actuators, valves, switches, microphones, pressure sensors, accelerators, and/or gyroscopes, for example.

FIG. 1A illustrates a cross-sectional view of some embodiments of a MEMS package 100 with a rough metal anti-stiction layer. The MEMS package 100 comprises a CMOS IC 102 comprising CMOS devices disposed within a CMOS substrate 104 and a MEMS IC 112 bonded to the CMOS IC 102. The MEMS IC 112 comprises a MEMS device layer 130 bonded the CMOS IC 102. The MEMS device layer 130 comprises a fixed portion 132 and a moveable mass 116. In some embodiments, the moveable mass 116 is connected to the fixed portion 132 by one or more cantilever beams or springs (not shown) and at least a portion of the moveable mass 116 can move in at least one direction with respect to the fixed portion 132. In some embodiments, the CMOS substrate 104 and the MEMS device layer 130 may comprise monocrystalline silicon. The MEMS device layer 130 is bonded to the CMOS substrate 104, enclosing a cavity 120 between the moveable mass 116 and the CMOS substrate 104. The moveable mass 116 is arranged in the cavity 120. An anti-stiction layer 110 is disposed over the CMOS substrate 104 and under the moveable mass 116. The anti-stiction layer 110 has a rough top surface 110s, which is configured to limit contact area to a lower surface 116s of the moveable mass 116 when the moveable mass 116 moves downwardly to reach the anti-stiction layer 110. Thus stiction is limited.

In some embodiments, a fixed electrode plate 106 is disposed over the CMOS substrate 104 between portions of the anti-stiction layer 110. A measurement circuit is configured to detect a distance change between the moveable mass 116 and the fixed electrode plate 106, for example based on changes of a varying current or voltage measured between the moveable mass 116 and the fixed electrode plate 106. Compared to the anti-stiction layer 110, the fixed electrode plate 106 has a smooth top surface 106s. An uppermost region of the rough top surface 110s is spaced apart from the lower surface 116s of the moveable mass 116 by a first vertical distance $d_1$, and an uppermost region of the smooth top surface 106s is spaced apart from the lower surface 116s of the moveable mass 116 by a second vertical distance $d_2$ that is greater than the first vertical distance $d_1$. In this way, the anti-stiction layer 110 prevents the moveable mass 116 from reaching and "sticking" to the fixed electrode plate 106. In some embodiments, the smooth top surface 106s has a surface height from a bottom surface of the fixed electrode plate 106 that is substantially same as a mean surface height of the rough top surface 110s. The mean surface height of the rough top surface 110s is a height from a mean surface 122s of the rough top surface 110s to a bottom surface of the anti-stiction layer 110. The height of the mean surface 122s is calculated from the roughness profile. In some embodiments, the anti-stiction layer 110 and the fixed electrode plate 106 comprise the same metal material and have the bottom surfaces substantially aligned one another. In some other embodiments, the anti-stiction layer 110 and the fixed electrode plate 106 can alternatively be made of different materials from one another. In some embodiments, the anti-stiction layer 110 may comprise aluminum (Al), nickel (Ni) or copper (Cu).

Figure 1B:
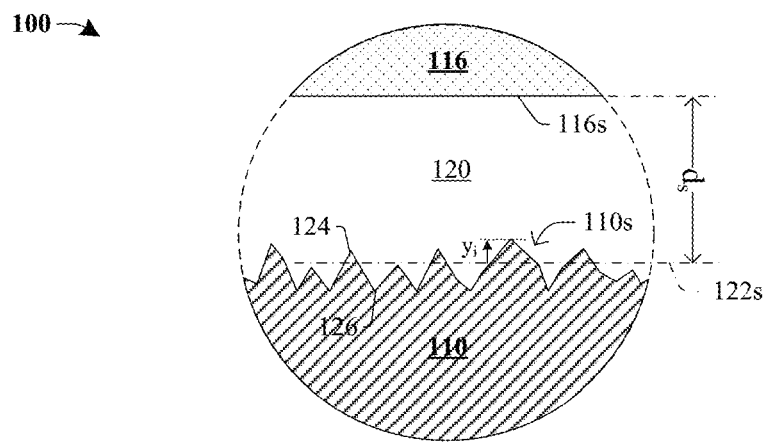
FIG. 1B illustrates a cross-sectional view of some embodiments of an enlarged portion of the MEMS package of FIG. 1A.

FIG. 1B illustrates a cross-sectional view of some embodiments of an enlarged portion of the MEMS package 100 of FIG. 1A. As shown in more detail in FIG. 1B, the rough top surface 110s of the anti-stiction layer 110 faces the lower surface 116s of the moveable mass 116 and has a series of peaks (e.g., 124) and valleys (e.g., 126), that reduce contact area between the moveable mass 116 and the anti-stiction layer 110. Thus, stiction force between the moveable mass 116 and anti-stiction layer 110 is decreased and the possibility of stiction is reduced. In some embodiments, the rough top surface 110s of anti-stiction layer 110 has a root mean square (RMS) surface roughness in a range of from about 10 nm to about 60 nm, preferably greater than 40 nm. The RMS surface roughness is calculated as the root mean square of a surface's measured microscopic peaks and valleys, as provided by the formula below:

$$R_q = \sqrt{\frac{1}{n}\sum_{i=1}^{n} y_i^2};$$

wherein $R_q$ is the RMS surface roughness of the anti-stiction layer 110, $y_i$ is the vertical distance from the mean surface 122 to each of n data points, which can be spaced at regular intervals on the mean surface 122. In some embodiments, a distance $d_s$ between the rough top surface 110s of the anti-stiction layer 110 and the lower surface 116s of the moveable mass 116 is less than 100 μm, for example, between about 10 μm and about 20 μm, such that stiction could be a consideration that may affect yield and performance of the MEMS package 100.

Figure 1C:
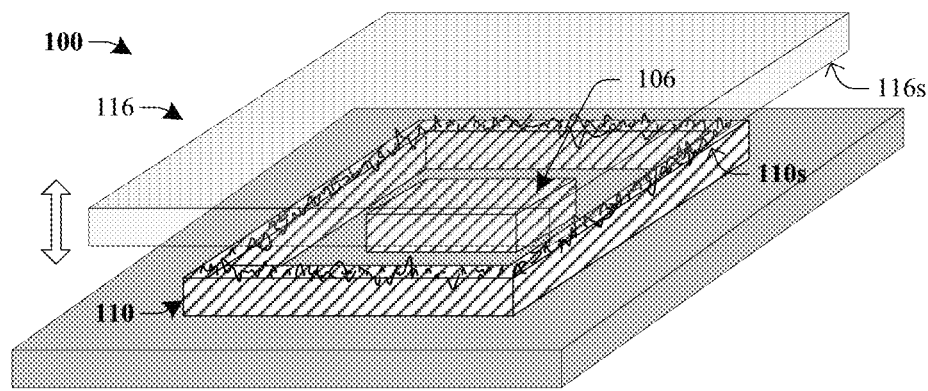
FIG. 1C illustrates a perspective view of some embodiments of a portion of the MEMS package of FIG. 1A.

FIG. 1C illustrates a perspective view of some embodiments of a portion of the MEMS package 100 of FIG. 1A. As shown in FIG. 1C, the anti-stiction layer 110 can have a ring shape surrounding the fixed electrode plate 106. The anti-stiction layer 110 can also be one or a plurality of rectangular, round or other suitable shaped portions disposed alongside the fixed electrode plate 106. During operation of the MEMS package 100, the moveable mass 116 can move with respect to the CMOS substrate 104 commensurate with a force experienced by the MEMS package 100. For example, if the MEMS package 100 is moved upward suddenly, the moveable mass 116 will tend to stay at rest such that the moveable mass 116 and CMOS substrate 104 will squeeze closer together during the acceleration. This temporary change in spacing due to the acceleration correspondingly provides a temporary change in a capacitance between the moveable mass 116 and the fixed electrode plate 106. The capacitance between the fixed electrode plate 106 and moveable mass 116 can be monitored, and the acceleration experienced by the MEMS device can then be calculated based on this monitored capacitance. In some cases, the acceleration is extreme that the lower surface 116s of the moveable mass 116 moves very close and may even reach on the rough top surface 110s of the anti-stiction layer 110. Since the peaks (see 124 in FIG. 1B) of the rough top surface 110s are closer to the moveable mass 116 than the smooth top surface 106s, the anti-stiction layer 110 prevents the fixed electrode plate 106 from contacting the moveable mass 116. Thereby, stiction between the fixed electrode plate 106 and the moveable mass 116 is limited. Further, compared to the rough top surface 116s which provides good mechanical anti-stiction properties, the smooth top surface 106s of the fixed electrode plate 106 provides good electrical properties for MEMS devices over different ICs in that the smoothness helps provide a consistent distance between the fixed electrode plate 106 and the lower surface of the moveable mass.

Figure 2:
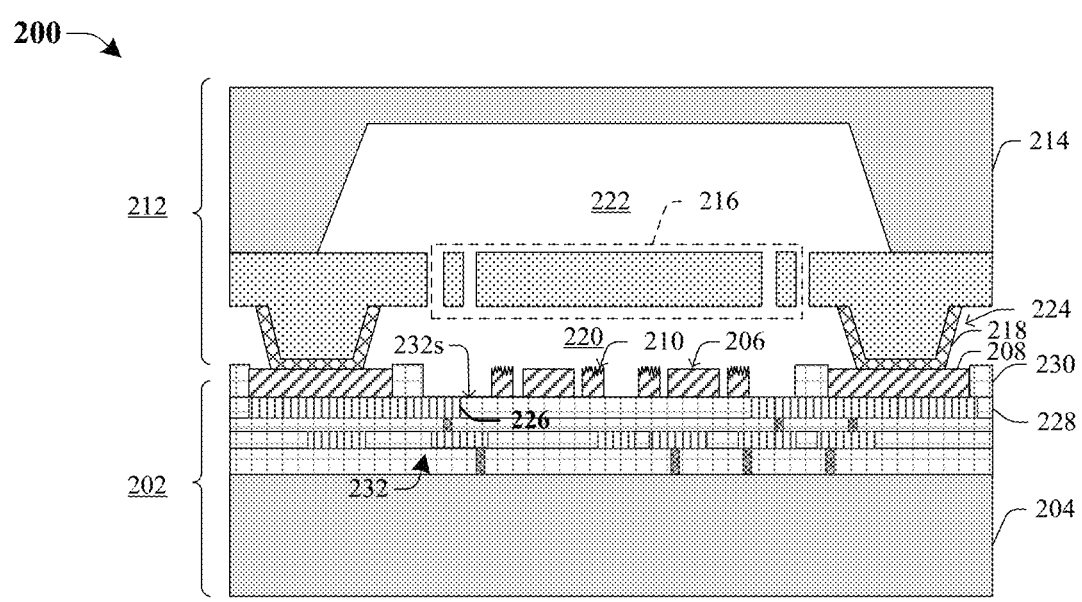
FIG. 2 illustrates a cross-sectional view of some other embodiments of a MEMS package with a rough metal anti-stiction layer.

FIG. 2 illustrates a cross-sectional view of some other embodiments of a MEMS package 200 with a rough metal anti-stiction layer. The MEMS package 200 comprises a CMOS IC 202 including a CMOS substrate 204 and an interconnect structure 232 disposed over the CMOS substrate 204. The interconnect structure 232 includes a plurality of metal layers disposed within a plurality of ILD layers. A MEMS IC 212 is bonded to an upper surface 232s of the interconnect structure 232 and, in cooperation with the CMOS IC 202, enclosing a cavity 220 between the MEMS IC 212 and the CMOS IC 202. A moveable mass 216 of the MEMS IC 212 is arranged within the cavity 220.

In some embodiments, the MEMS IC 212 further comprises a capping substrate 214 having a recess 222 disposed directly above the moveable mass 216 and which constitutes a portion of the cavity 220 in fluid communication with a lower portion between the moveable mass 216 and the CMOS IC 202. The cavity 220 is hermetically sealed from the ambient environment surrounding the MEMS package 200. In other embodiments, the capping substrate 214 encloses the recess 222 in cooperation with the moveable mass 216 to form a second hermetically sealed cavity that is isolated from the cavity 220 having the same or different pressures. The moveable mass 216 can be a flexible MEMS membrane, and/or other MEMS structures, configured to deflect in proportion to external stimuli, such as pressure, acceleration, etc.

An anti-stiction layer 210 is disposed on the upper surface 232s of the interconnect structure 232 under the moveable mass 216. In some embodiments, the anti-stiction layer 210 is made of metal and has a rough top surface. The MEMS package 200 may further comprise a fixed electrode plate 206 disposed on the upper surface 232s of the interconnect structure 232 under the moveable mass 216, coupled to a measurement circuit configured to detect a distance change between the moveable mass 216 and the fixed electrode plate 206 through capacitive coupling of the moveable mass 216 and the fixed electrode plate 206. In some embodiments, the fixed electrode plate 206 is made of the same metal as the anti-stiction layer 210 but has a smooth top surface.

In some embodiments, the MEMS package 200 further comprises a bonding structure 224 disposed between the MEMS IC 212 and the CMOS IC 202, configured to bond the two together. In some embodiments, the bonding structure 224 can be a semiconductor-to-metal bonding structure where a first bonding pad 208 of the CMOS IC 202 comprises a metal material such as Al, Cu, Ti, Ta, Au, Ni, Sn and a second bonding pad 218 of the MEMS IC 212 comprises a semiconductor material such as Ge, Si, SiGe. In some other embodiments, the bonding structure 224 can be a eutectic bonding structure and the first bonding pad 208 and the second bonding pad 218 each including at least one of Al, Cu, Ti, Ta, Au, Ni, Sn, or another metal. As an example, the first bonding pad 208 can comprise aluminum and the second bonding pad 218 can comprise germanium. In some embodiments, the first bonding pad 208 or the second bonding pad 218 can be a conformal layer lining a protrusion portion of the CMOS IC 202 or the MEMS IC 212. The first bonding pad 208 can be disposed on the upper surface 232s of the interconnect structure 232 and comprise the same metal with a substantially same thickness of anti-stiction layer 210. In some embodiments, the upper surface 232s of the interconnect structure 232 is a top surface of a top ILD layer 228 surrounding a top metal layer 226 as shown in FIG. 2. The first bonding pad 208 and the fixed electrode plate 206 can be respectively coupled to the CMOS devices of the CMOS IC 202 through metal lines of the top metal layer 226. In some embodiments, an additional dielectric layer 230 is disposed over the top ILD layer 228 and surrounds the first bonding pad 208. In some embodiments, the bonding structure 224 can have a ring-like configuration as viewed from top, and the first and second bonding pads 208, 218 can laterally surround the cavity 220. In some other embodiments, the first bonding pad 208, the anti-stiction layer 210 and the fixed electrode plate 206 are disposed aligned within an uppermost metallization plane of the interconnect structure 232.

In some embodiments, the CMOS substrate 204, or the capping substrate 214 may comprise bulk semiconductor substrates including one or more of, for example, silicon, germanium, silicon carbide, a group III element, and a group V element. In other embodiments, the CMOS substrate 204 or the capping substrate 214 are semiconductor-on-insulator (SOI) substrates, such as silicon-on-insulator or polysilicon-on-insulator (POI) substrates, for example.

Therefore, as can be seen from the above embodiments, a rough metal anti-stiction layer can be advantageous in reducing stiction in MEMS structures. The precise surface roughness that is present for the metal anti-stiction layer can vary depending on the manufacturing processes and conditions, such as annealing temperature and time, but typically exhibit a rough surface of peaks and valleys. These peaks and valleys are often irregular, with the depths and widths of the valleys varying over a length or area of the surface, and/or the height and widths of the peaks also varying over a length or area of the surface. Aside from advantageously limiting stiction, metal anti-stiction layer is simple to incorporate into modern semiconductor manufacturing process, and is compatible with other MEMS materials (e.g. bulk silicon). It also avoids contamination problem of the other anti-stiction coatings.

FIGS. 3-11 illustrate a series of cross-sectional views of some embodiments of a method for manufacturing a MEMS package with a rough metal anti-stiction layer at various stages of manufacture.

Figure 3:
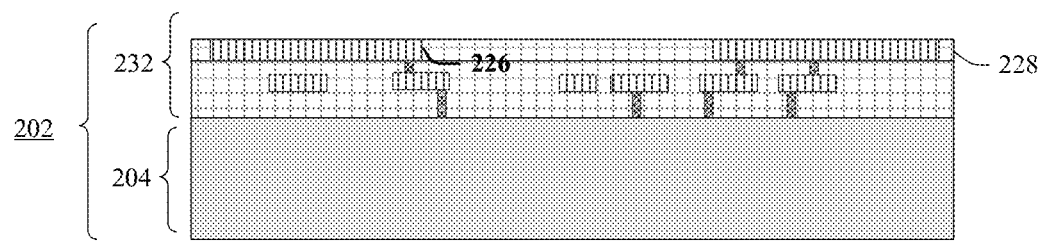
FIGS. 3-11 illustrate a series of cross-sectional views of some embodiments of a method for manufacturing a MEMS package with a rough metal anti-stiction layer at various stages of manufacture.

As shown in cross-sectional view 300 of FIG. 3, a CMOS IC 202, which includes an interconnect structure 232 over a CMOS substrate 204, is provided. A plurality of CMOS devices are formed within the CMOS substrate 204. In various embodiments, the CMOS substrate 204 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the interconnect structure 232 may be formed by forming one or more dielectric layers such as inter-layer dielectrics (ILD) over a front surface of the CMOS substrate 204. The ILD layers are subsequently etched to form via holes and/or metal trenches. The via holes and/or metal trenches are then filled with a conductive material to form a plurality of metal layers. In some embodiments, the ILD layers may be deposited by a physical vapor deposition technique (e.g., PVD, CVD, etc.). The plurality of metal layers may be formed using a deposition process and/or a plating process (e.g., electroplating, electro-less plating, etc.). In various embodiments, the plurality of metal layers may comprise tungsten, copper, or aluminum copper, for example. In some embodiments, a top metal layer 226 of the plurality of metal layers has an upper surface aligned with an upper surface of the top ILD layer 228 of the plurality of ILD layers.

Figure 4:
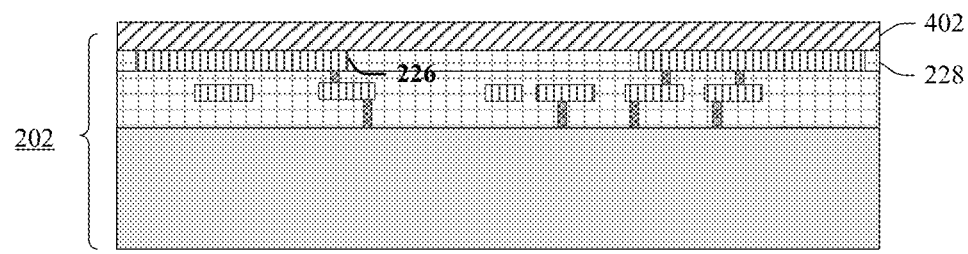

As shown in cross-sectional view 400 of FIG. 4, a metal layer 402 is formed over the CMOS IC 202. In some embodiments, the metal layer is formed directly on the upper surfaces of the top metal layer 226 and the top ILD layer 228. In some embodiments, the metal layer is formed by a chemical vapor deposition process, such as low pressure chemical vapor deposition (LPCVD), plasma-enhanced chemical vapor deposition (PECVD) or an atmospheric pressure chemical vapor deposition (APCVD) growth process. In some embodiments, the metal layer may comprise aluminum (Al), nickel (Ni) or copper (Cu).

Figure 5:
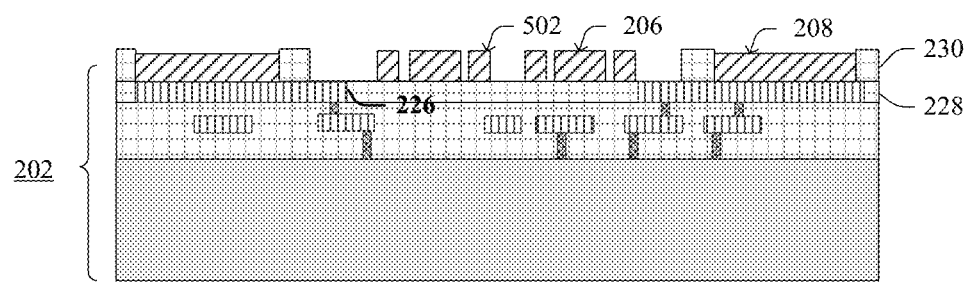

As shown in cross-sectional view 500 of FIG. 5, the metal layer 402 is patterned to form an anti-stiction precursor 502, a fixed electrode plate 206 and a first bonding pad 208. An additional dielectric layer 230 can be formed to surround the first bonding pad 208.

Figure 6:
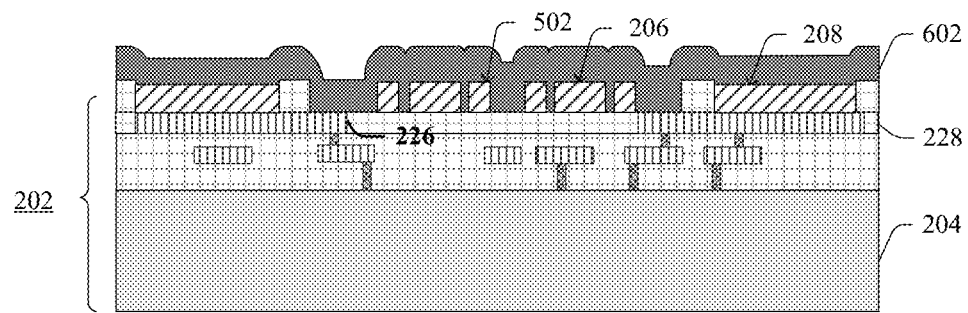

As shown in cross-sectional view 600 of FIG. 6, an amorphous silicon layer 602 is formed on exposed surfaces of the interconnect structure and the patterned metal layer. In some embodiments, the amorphous silicon layer 602 is formed by a chemical vapor deposition process, such as low pressure chemical vapor deposition (LPCVD), plasma-enhanced chemical vapor deposition (PECVD) or an atmospheric pressure chemical vapor deposition (APCVD) growth process. For example, the amorphous silicon layer 602 can be formed by a PECVD process at a temperature lower than about 400° C.

Figure 7:
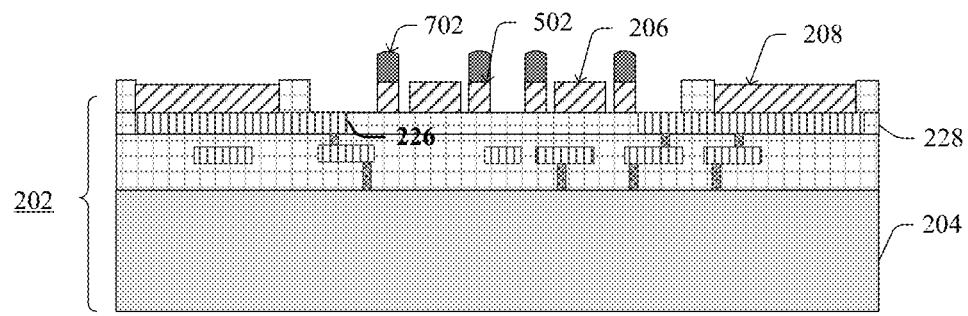

As shown in cross-sectional view 700 of FIG. 7, the amorphous silicon layer 602 is patterned to leave a portion 702 on the anti-stiction precursor 502 and to remove remaining portions such as a second portion of the amorphous silicon layer 602 on the fixed electrode plate 206.

Figure 8:
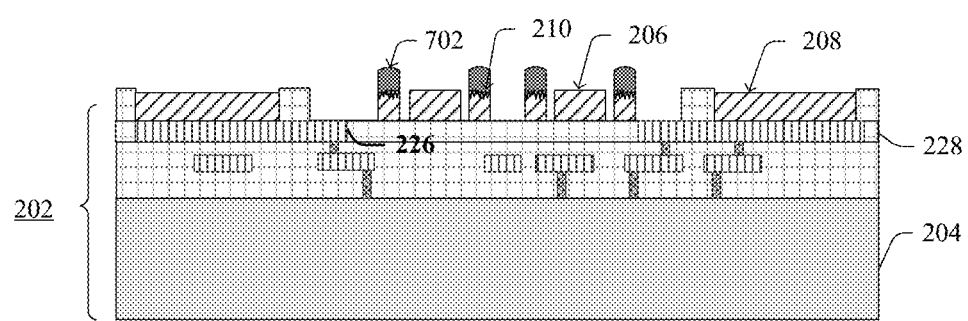

As shown in cross-sectional view 800 of FIG. 8, an annealing process is performed to facilitate inter-diffusion between the portion 702 of the amorphous silicon layer and the anti-stiction precursor 502 such that the anti-stiction precursor 502 converts to an anti-stiction layer 210 with a rough top surface. Metal silicide micro-particles can be formed at an interface of the anti-stiction layer 210 and the portion 702 of the amorphous silicon layer through a granulation process of the anti-stiction precursor 502 at applicable temperatures. The size, density, and the composition of the micro-particles could be controlled by adjusting the annealing temperature, time, and the film thickness. As an example, the anti-stiction layer 210 can be made of aluminum and be annealed at a temperature of about 430° C. for about 1 hour. A diameter of the formed micro-particles can be in a range of about several tens of nanometers.

Figure 9:
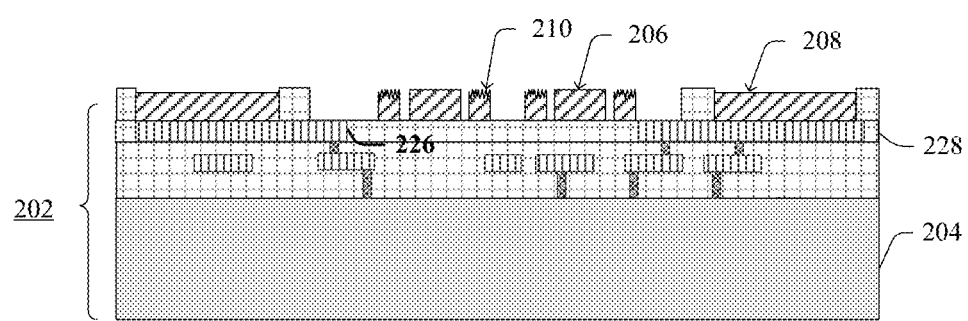

As shown in cross-sectional view 900 of FIG. 9, an etching process is performed to remove the portion 702 of the amorphous silicon layer and to leave a rough top surface of the anti-stiction layer 210 exposed. In some embodiments, the portion 702 of the amorphous silicon layer is removed by a selective etching process such as a Reactive Ion Etching (RIE) process, for example.

Figure 10:
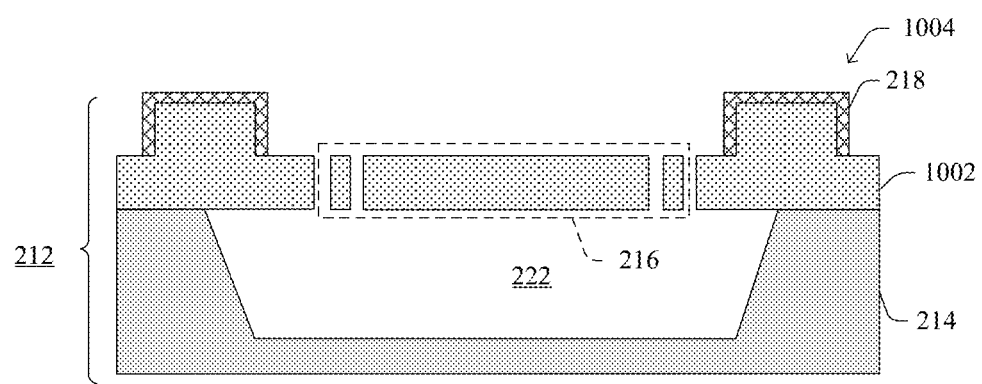

As shown in cross-sectional view 1000 of FIG. 10, a MEMS IC 212 is provided. In some embodiments, a MEMS device layer 1002 is etched back from a front side to form a protrusion 1004 at a position to be bonded to the CMOS IC. A second bonding pad 218 is formed on the protrusion 1004. In some embodiments, the second bonding pad 218 is formed conformally covering sidewalls of the protrusion 1004. In some embodiments, a capping substrate 214 is bonded to the MEMS device layer 1002 at a back side that is opposite to the protrusion 1004. The capping substrate 214 can be prepared from a bulk semiconductor wafer 302 including, for example, a monocrystalline wafer, or another substrate made of germanium, silicon carbide, a group III element, and/or a group V element, for example. In some embodiments, a recess 222 can be etched to a proper depth at a location corresponding to moveable or flexible portion of the MEMS device layer. Notably, among other considerations, applicable heights of the protrusion 1004 and the recess 222 are formed with a consideration of providing sufficient space for motion and/or suitable stiction force between a moveable or flexible part of the MEMS device to be formed and a neighboring component. The MEMS device layer 1002 is patterned to form MEMS devices including a moveable mass 216. The MEMS devices include, for example, micro-actuators or micro-sensors such as a microvalve, a micro-switch, a microphone, a pressure sensor, an accelerator, a gyroscope or any other device having a moveable or flexible part that moves or flexes with respect to the fixed portion.

Figure 11:
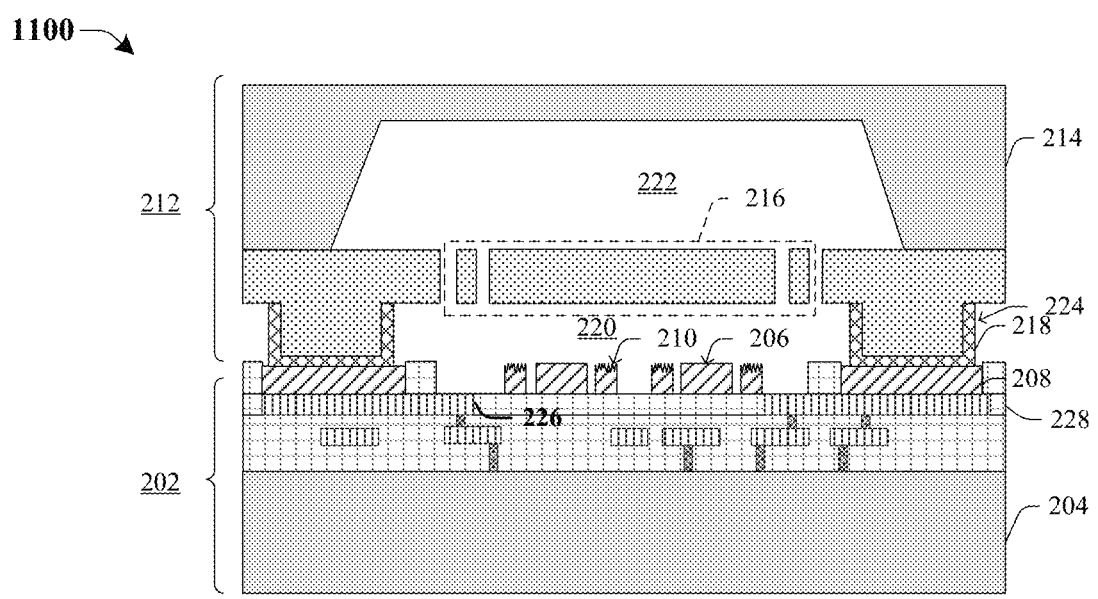

As shown in cross-sectional view 1100 of FIG. 11, the MEMS IC 212 is bonded to the CMOS IC 202. A cavity 220 is enclosed between the moveable mass 216 and the fixed electrode plate 206. In some embodiments, the MEMS IC 212 and the CMOS IC 202 are bonded by semiconductor-to-metal bonding where the first bonding pad 208 comprises metal materials such as Al, Cu, Ti, Ta, Au, Ni, Sn and the second bonding pad 218 comprises semiconductor materials such as Ge, Si, SiGe. In some other embodiments, the MEMS IC 212 and the CMOS IC 202 are bonded by eutectic bonding between two metal materials each including at least one of Al, Cu, Ti, Ta, Au, Ni, Sn, or another metal. The materials to be bonded are pressed against each other in an annealing process to form a eutectic phase of the materials. For example, a eutectic bonding between Ge and Al is formed at an annealing temperature in a range from 400° C. to 450° C. After the MEMS IC 212 is bonded to the CMOS IC 202, the MEMS package is formed when the bonded CMOS IC 202 and MEMS IC 212, which are often bonded at the wafer level, are diced into separate chips after bonding.

Figure 12:
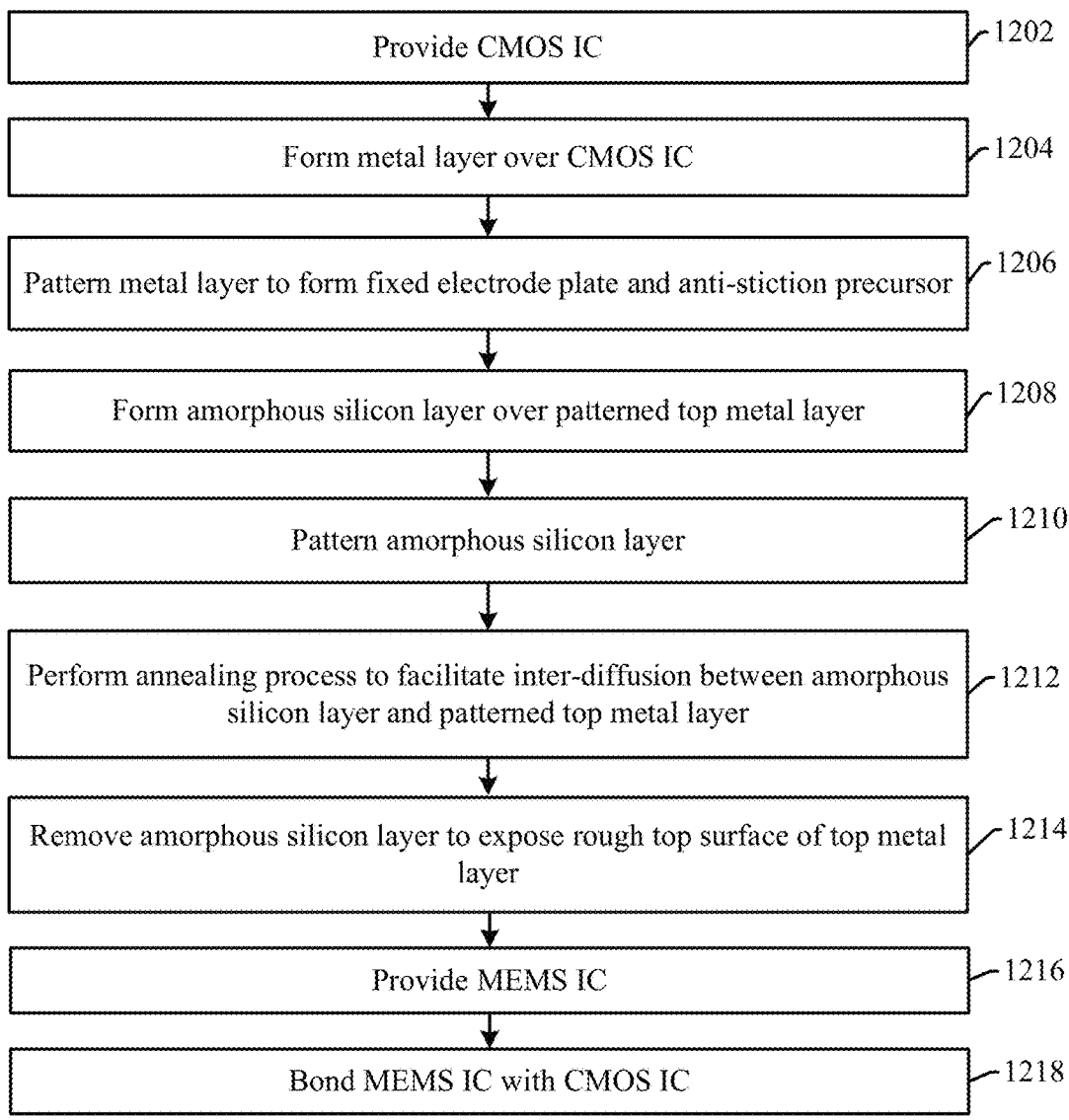
FIG. 12 illustrates a flow diagram of some embodiments of a method for manufacturing a MEMS package with a rough metal anti-stiction layer.

FIG. 12 illustrates a flow diagram of some embodiments of a method for manufacturing a MEMS package with a rough metal anti-stiction layer.

While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1202, a CMOS IC is provided. CMOS devices are formed within a CMOS substrate and an interconnect structure including a plurality of metal layers formed within a plurality of ILD layers is formed over the CMOS substrate. FIG. 3 illustrates a cross-sectional view corresponding to some embodiments corresponding to act 1202.

At 1204, a metal layer is formed over the CMOS IC. In some embodiments, the metal layer is formed directly on an upper surface of the interconnect structure. FIG. 4 illustrates a cross-sectional view corresponding to some embodiments corresponding to act 1204.

At 1206, the metal layer is patterned to form an anti-stiction precursor, a fixed electrode plate, and a first bonding pad. FIG. 5 illustrates a cross-sectional view corresponding to some embodiments corresponding to act 1206.

At 1208, an amorphous silicon layer is formed over the patterned metal layer. In some embodiments, the amorphous silicon layer can be formed by a PECVD process. FIG. 6 illustrates a cross-sectional view corresponding to some embodiments corresponding to act 1208.

At 1210, the amorphous silicon layer is patterned to leave a portion on the anti-stiction layer and to remove remaining portions of the anti-stiction layer. FIG. 7 illustrates a cross-sectional view corresponding to some embodiments corresponding to act 1210.

At 1212, an annealing process is performed. The annealing process facilitates inter-diffusion between the amorphous silicon and the anti-stiction layer to form silicide micro-particles at an interface. FIG. 8 illustrates a cross-sectional view corresponding to some embodiments corresponding to act 1212.

At 1214, the amorphous silicon layer is removed. In some embodiments, the amorphous silicon layer is removed by a RIE process. After removing the amorphous silicon layer together with the silicide micro-particles, a rough top surface of the anti-stiction layer is exposed. FIG. 9 illustrates a cross-sectional view corresponding to some embodiments corresponding to act 1214.

At 1216, a MEMS IC is provided. In some embodiments, a MEMS device layer is prepared for following bonding process by forming a protrusion and a second bonding pad for the MEMS IC. MEMS structures are formed including forming a moveable mass. In some embodiments, a capping substrate is bonded to a back side of the MEMS device layer. FIG. 10 illustrates a cross-sectional view corresponding to some embodiments corresponding to act 1216.

At 1218, the MEMS IC is bonded to the CMOS IC. A cavity can be enclosed between the moveable mass of the MEMS IC and the fixed electrode plate on the CMOS IC. FIG. 11 illustrates a cross-sectional view corresponding to some embodiments corresponding to act 1218.

Thus, as can be appreciated from above, the present disclosure relates to a MEMS package with a rough metal anti-stiction layer to improve stiction characteristics, and associated methods of forming such a MEMS package. The MEMS package comprises a MEMS IC bonded to a CMOS IC and an anti-stiction layer is disposed on the CMOS IC under a moveable mass of the MEMS IC. In some embodiments, the anti-stiction layer is formed by forming an amorphous silicon layer on a metal precursor followed by performing an annealing process. The annealing process facilitates inter-diffusion and formation of silicide micro-particles at an interface between the metal precursor and the amorphous silicon layer. Then the amorphous silicon is removed, together with the formed silicide micro-particles, leaving a rough surface for the metal precursor.

In some embodiments, the present disclosure relates to a method for manufacturing a microelectromechanical systems (MEMS) package. The method comprises providing a CMOS IC including CMOS devices arranged within a CMOS substrate. The method further comprises forming and patterning a metal layer over the CMOS substrate to form an anti-stiction layer and a fixed electrode plate and forming a rough top surface for the anti-stiction layer. The method further comprises providing a MEMS IC comprising a moveable mass arranged within a recess of a MEMS substrate and bonding the CMOS IC to the MEMS IC to enclose a cavity between the moveable mass and the fixed electrode plate and the anti-stiction layer.

In other embodiments, the present disclosure relates to a method for manufacturing a microelectromechanical systems (MEMS) package. The method comprises providing a CMOS IC including CMOS devices arranged within a CMOS substrate and providing a MEMS IC comprising a moveable mass arranged within a recess of a MEMS substrate. The method further comprises forming an anti-stiction layer and a fixed electrode plate at a position spaced apart from the moveable mass. The method further comprises bonding the CMOS IC to the MEMS IC to enclose a cavity between the moveable mass and the fixed electrode plate and the anti-stiction layer.

In yet other embodiments, the present disclosure relates to a method for manufacturing a microelectromechanical systems (MEMS) package. The method comprises providing a CMOS IC comprising CMOS devices disposed within a CMOS substrate. The method further comprises forming an anti-stiction layer over the CMOS substrate. The method further comprises bonding a MEMS device layer to the CMOS IC. The MEMS device layer comprises a fixed portion and a moveable mass connected to the fixed portion and over the anti-stiction layer. The method further comprises bonding a capping substrate to a back side of the MEMS device layer opposite to the CMOS IC so as to enclose a cavity between the capping substrate and the CMOS substrate. The moveable mass is arranged in the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) package, the method comprising:
providing a CMOS IC including CMOS devices arranged within a CMOS substrate;
forming and patterning a metal layer over the CMOS substrate to form an anti-stiction layer and a fixed electrode plate;
forming a rough top surface for the anti-stiction layer;
providing a MEMS IC comprising a moveable mass arranged within a recess of a MEMS substrate; and
bonding the CMOS IC to the MEMS IC to enclose a cavity between the moveable mass and the fixed electrode plate and the anti-stiction layer.

2. The method of claim 1, wherein forming the rough top surface for the anti-stiction layer comprises:
forming an amorphous silicon layer on the metal layer;
patterning the amorphous silicon layer to leave a first portion on the anti-stiction layer and to remove a second portion from over the fixed electrode plate;
perform an annealing process to facilitate an inter-diffusion between the anti-stiction layer and the amorphous silicon layer; and
removing the amorphous silicon layer after the annealing process.

3. The method of claim 2, wherein the amorphous silicon layer is formed by a Plasma Enhanced Chemical Vapor Deposition (PECVD) process.

4. The method of claim 2, wherein the amorphous silicon layer is removed by a Reactive Ion Etching (RIE) process.

5. The method of claim 1,
wherein the CMOS IC and the MEMS IC are bonded through a eutectic bonding structure comprising a first bonding pad on the CMOS IC and a second bonding pad on the MEMS IC;

wherein the first bonding pad is formed by forming and patterning the metal layer and has a thickness that is substantially the same as the anti-stiction layer.

6. A method for manufacturing a microelectromechanical systems (MEMS) package, the method comprising:
provndmg a CMOS IC including CMOS devices arranged within a CMOS substrate;
providing a MEMS IC comprising a moveable mass arranged within a recess of a MEMS substrate;
forming an anti-stiction layer and a fixed electrode plate at a position spaced apart from the moveable mass; and
bonding the CMOS IC to the MEMS IC to enclose a cavity between the moveable mass and the fixed electrode plate and the anti-stiction layer.

7. The method of claim 6, wherein the anti-stiction layer is formed as a ring shape surrounding the fixed electrode plate.

8. The method of claim 6, wherein the anti-stiction layer and the fixed electrode plate are concurrently made by forming and patterning a metal layer.

9. The method of claim 8, wherein the anti-stiction layer and the fixed electrode plate are concurrently made with a bonding pad for the bonding of the CMOS IC and the MEMS IC.

10. The method of claim 8, after forming and patterning a metal layer; further comprising performing an etch to form a rough top surface for the anti-stiction layer.

11. The method of claim 10, wherein the rough top surface of the anti-stiction layer has a root mean square (RMS) surface roughness in a range of from about 40 nm to about 60 nm.

12. The method of claim 10, wherein when forming the rough top surface for the anti-stiction layer, the fixed electrode plate is not etched such that to leave a smooth top surface for the fixed electrode plate, wherein the smooth top surface has a surface height that is substantially same with a mean surface height of the rough top surface of the anti-stiction layer.

13. The method of claim 10, wherein forming the rough top surface for the anti-stiction layer comprises:
forming an amorphous silicon layer on the metal layer;
patterning the amorphous silicon layer to leave a first portion on the anti-stiction layer and to remove a second portion from over the fixed electrode plate;
perform an annealing process to facilitate an inter-diffusion between the anti-stiction layer and the amorphous silicon layer; and
removing the amorphous silicon layer after the annealing process.

14. The method of claim 13, wherein the amorphous silicon layer is formed by a Plasma Enhanced Chemical Vapor Deposition (PECVD) process.

15. The method of claim 13, wherein the amorphous silicon layer is removed by a Reactive Ion Etching (RIE) process.

16. The method of claim 6, wherein forming the CMOS IC comprises forming the CMOS substrate and an interconnect structure over the CMOS substrate, wherein the interconnect structure includes a plurality of metal layers disposed within a plurality of dielectric layers.

17. The method of claim 6, wherein the anti-stiction layer comprises aluminum (Al).

18. A method for manufacturing a microelectromechanical systems (MEMS) package, the method comprising:
providing a CMOS IC comprising CMOS devices disposed within a CMOS substrate;
forming an anti-stiction layer over the CMOS substrate;
bonding a MEMS device layer to the CMOS IC, the MEMS device layer comprising a fixed portion and a moveable mass connected to the fixed portion and over the anti-stiction layer; and
bonding a capping substrate to a back side of the MEMS device layer opposite to the CMOS IC so as to enclose a cavity between the capping substrate and the CMOS substrate, wherein the moveable mass is arranged in the cavity.

19. The method of claim 18, further comprising forming a fixed electrode plate over the CMOS substrate between portions of the anti-stiction layer, wherein the anti-stiction layer and the fixed electrode plate are made of the same metal material.

20. The method of claim 18, further comprising forming a eutectic bonding structure of a first bonding pad on the CMOS IC and a second bonding pad on the MEMS device layer;
wherein the anti-stiction layer and the first bonding pad are made of the same metal material and have substantially the same thickness.

* * * * *